United States Patent
Jerred

(10) Patent No.: US 6,376,314 B1
(45) Date of Patent: Apr. 23, 2002

(54) METHOD OF SEMICONDUCTOR DEVICE FABRICATION

(75) Inventor: Paul Antony Jerred, Manchester (GB)

(73) Assignee: Zetex Plc., Chadderton (GB)

( * ) Notice: Subject to any disclaimer, the term of this patent is extended or adjusted under 35 U.S.C. 154(b) by 0 days.

(21) Appl. No.: 09/530,802

(22) PCT Filed: Nov. 6, 1998

(86) PCT No.: PCT/GB98/03333

§ 371 Date: Jun. 23, 2000

§ 102(e) Date: Jun. 23, 2000

(87) PCT Pub. No.: WO99/25016

PCT Pub. Date: May 20, 1999

(30) Foreign Application Priority Data

Nov. 7, 1997 (GB) .............................................. 9723468

(51) Int. Cl.[7] ..................... H01L 21/336; H01L 21/338; H01L 21/425
(52) U.S. Cl. ........................ 438/270; 438/184; 438/303; 438/524; 438/525; 438/527
(58) Field of Search .............................. 438/268, 270, 438/184, 302, 303, 639, 529, 525, 561, 527, 138

(56) References Cited

U.S. PATENT DOCUMENTS

| 5,086,007 A | * | 2/1992 | Ueno | 437/41 |
| 5,156,985 A | * | 10/1992 | Yamada et al. | 437/35 |
| 5,578,508 A | | 11/1996 | Baba et al. | 21/265 |
| 5,652,152 A | | 7/1997 | Pan et al. | 437/26 |
| 5,915,195 A | * | 6/1999 | Fullford, Jr. et al. | 438/524 |
| 6,051,468 A | * | 4/2000 | Hshieh | 438/270 |
| 6,103,578 A | * | 8/2000 | Uenishi et al. | 438/268 |

FOREIGN PATENT DOCUMENTS

| FR | 2647596 | 11/1990 |
| GB | 2286082 | 2/1995 |
| WO | WO 97/00536 | 3/1997 |

* cited by examiner

*Primary Examiner*—John F. Niebling
*Assistant Examiner*—Viktor Simkovic
(74) *Attorney, Agent, or Firm*—Foley & Lardner

(57) ABSTRACT

A method of semiconductor device fabrication comprising forming at least the indentation in a surface of a semiconductor body. The indentation is partially filled with a filler material such that walls of the indentation are exposed above an upper surface of the filler material. First and second dopants are introduced through the exposed walls of the indentation and first and second doped regions formed. The first doped region extends into the semiconductor body around the filled portion of the indentation to a first region boundary which is at a predetermined first depth relative to the upper surface of the filler material. The second doped region extends into the semiconductor body around the filled portion of the indentation to a second region boundary which is at a predetermined second depth relative to the upper surface of the filler material. The first and second depths are different such that a region of predetermined thickness is defined adjacent the indentation between the first and second boundaries.

20 Claims, 3 Drawing Sheets

METHOD OF SEMICONDUCTOR DEVICE FABRICATION

BACKGROUND OF THE INVENTION

1. Field of the Invention

This invention relates to a method of semiconductor device fabrication, and particularly but not exclusively to a method for fabricating power transistors with a vertical channel MOS gate structure.

2. Description of Related Art

Conventional vertical DMOS power transistors are known having a plurality of 'cells', each cell comprising a gate disposed on an uppermost surface of a wafer, and a source region located adjacent a lower surface of the gate. A body region is provided beneath the gate and adjacent the source, such that in an on-state a field from the gate forms a horizontal conducting channel in the body, allowing current to flow laterally across the body regions, and through a drain region located between and beneath the body regions to a drain contact located at a lowermost surface of the substrate. Such conventional DMOS structures suffer from the presence of a parasitic Junction-FET region located between adjacent cells, the resistance of which increases rapidly as the spacing between adjacent cells is reduced below a critical dimension. This mechanism creates an inherent packing density limitation, restricting the extent to which on-state resistance in the conventional vertical DMOS structure may be reduced by means of geometry scaling.

The above limitations are mitigated by an alternative known UMOS structure in which the gate regions are disposed adjacent to the vertical sidewalls of U-shaped indentations or trenches formed in a wafer surface. An associated source region is disposed adjacent the upper part of each gate, and a body region is located directly below the source. When the gate region is turned on, a field penetrates from the gate into the body region, thereby forming a vertical conducting channel which allows current to flow vertically between the source and the drain. Because UMOS structures feature such vertical rather than lateral channel regions, they have no parasitic Junction-FET elements and thus do not suffer from the limitations that these elements impose on the conventional DMOS structure.

A method of fabricating a UMOS structure with self-aligned source regions is known from British Patent Specification No. GB 2 264 388. In this known method, a p-type (body) semiconductor region is formed on top of an n-type (drain) semiconductor layer. Practically, the p-type region is likely to be formed either by means of a doped epitaxial deposition of specified thickness onto the surface of the n-type layer, or by the introduction of p-type dopant into the surface of the n-type layer followed by thermal processing to determine the junction depth. A material (typically silicon-dioxide) is grown or deposited on the top surface of this structure and is selectively etched to form a trench masking layer. Trenches or grooves are then formed beneath the apertures in this mask such that they extend from the surface through the p-type region and part-way into the n-type region. A dielectric layer is then formed on the walls of the grooves, and the grooves are partially filled with a gate electrode material, for example polysilicon. This gate electrode material is either deposited at a layer thickness which results in partial filling of the grooves, or (more practically) is initially deposited such that it fills the grooves completely, and then etched back to leave the grooves partially-filled. With the trench-masking layer still in place on the first surface, source dopant is then introduced into the exposed sidewalls of the grooves, above the etched-back gate electrode.

The above known method has advantages with respect to earlier structures (for example that described in FIG. 17 of GB 2 264 388, in which the source dopant is introduced selectively via the substrate surface) because it is not necessary to define via photolithography and with a high degree of accuracy the lateral positional relation between the source regions and the grooves. This allows the distance separating adjacent grooves to be reduced and thereby a higher density of grooves implemented, improving on-state performance. However the method described with reference to FIG. 16 of GB 2 264 388nevertheless still exhibits disadvantages in that the vertical distance separating the source regions from the drain region, known as the channel width, is dependent on the final etched-back position of the top of the gate electrode material. This position is in turn a function of both the initial depth of the grooves, the depth of the initially-deposited gate electrode layer and/or the precise amount of gate electrode material removed during the etchback process step. Variations in these parameters introduce inconsistencies into the channel width dimension, as practically fabricated using this method. It is desirable to minimise the channel width dimension in order to optimise performance when the structure is active, and these inconsistencies restrict the degree to which this can be practically achieved.

SUMMARY OF THE DISCLOSURE

It is an object of the present invention to obviate or mitigate the above-described disadvantages.

In accordance with the present invention, there is provided a method of semiconductor device fabrication comprising forming at least one indentation in a surface of a semiconductor body, partially filling the indentation with a filler material such that walls of the indentation are exposed above an upper surface of the filler material, and introducing and diffusing first and second dopants through the exposed walls of the indentation to form first and second doped regions, the first doped region extending into the semiconductor body around the filled portion of the indentation to a first region boundary which is at a predetermined first depth relative to the upper surface of the filler material, and the second doped region extending into the semiconductor body around the filled portion of the indentation to a second region boundary which is at a predetermined second depth relative to the upper surface of the filler material, the first and second depths being different such that a region of predetermined thickness is defined adjacent the indentation between the first and second boundaries.

Preferably, the indentations are elongate trenches, and may have U-shaped cross-section.

The step of partially filling the indentations with a filler material may comprise filling completely the indentations with filler material, then etching the filler material part way into the indentations.

Preferably, the filler material is polysilicon.

Preferably, a layer of dielectric is formed upon surfaces of the trench prior to the trench being partially filled. Dopant may be introduced into the side walls of the trench through this dielectric layer. Alternatively, the dielectric layer may be at least partially removed from those surfaces of the trench which are exposed above the partially filled portion of the trench, prior to the introduction of dopant.

Preferably, at least a portion of the trench masking layer is retained on the said surface of the semiconductor body and functions as a barrier to introduction of at least one of the dopants.

Preferably, at least one of the dopants is produced by an ionic source which is disposed at an angle to the trench.

In one embodiment, the first dopant is arranged to penetrate further into the side walls of the trench than the second dopant, and the second dopant is prevented from entering at least part of the first surface of the semiconductor by means of an at least partially retained trench masking layer on the first surface. The thickness and composition of the trench masking layer may be chosen such that it functions as an effective barrier to an implant of the second dopant carried out at low energy, but is a relatively poor barrier to an implant of the first dopant carried out at high energy. Preferably in this embodiment, the semiconductor device is a MOSFET with gate electrode regions provided by the filler material, and body and source regions provided by the first and second doped regions.

In an alternative embodiment the choice of dopant species and diffusion conditions is such that the second dopant penetrates further than the first, the first dopant providing the MOSFET source region and the second dopant the MOSFET body region. In this case, the masking layer used to define the trench etch is at least partially retained at the stage of first (source) dopant introduction, but may be partially or wholly removed prior to introduction of the second (body) dopant, enhancing the degree to which body dopant enters the substrate via the first surface.

In any embodiment the MOSFET may be a n-p-n (n-channel type) or a p-n-p (p-channel type) structure.

The semiconductor body may be formed on a further body of semiconductor which defines a drain region. A further layer of opposite conductivity type to the further body of semiconductor may be formed on the side of the further body of semiconductor remote from the said surface of the semiconductor body.

BRIEF DESCRIPTION OF THE DRAWINGS

Embodiments of the invention will now be described by way of example, with reference to the accompanying drawings, in which.

DETAILED DESCRIPTION OF PREFERRED EMBODIMENTS

Figure 1:
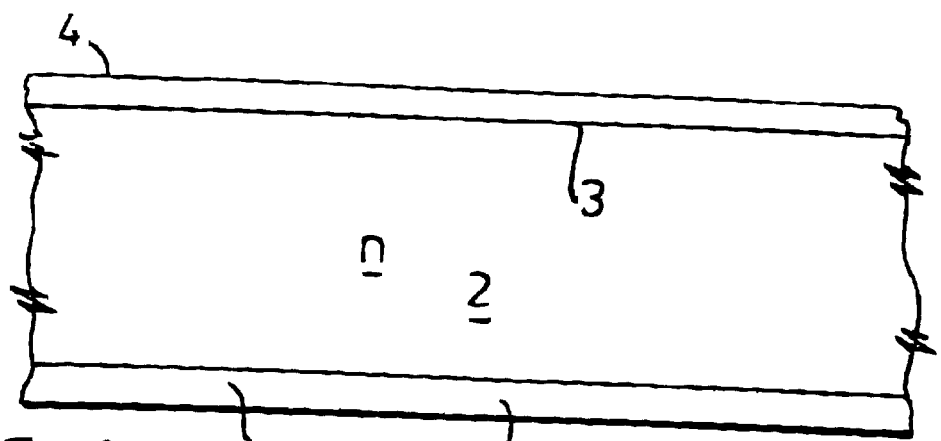
FIG. 1 is a schematic illustration of a cross-section of a part of a semiconductor body covered by a mask.
Figure 2:
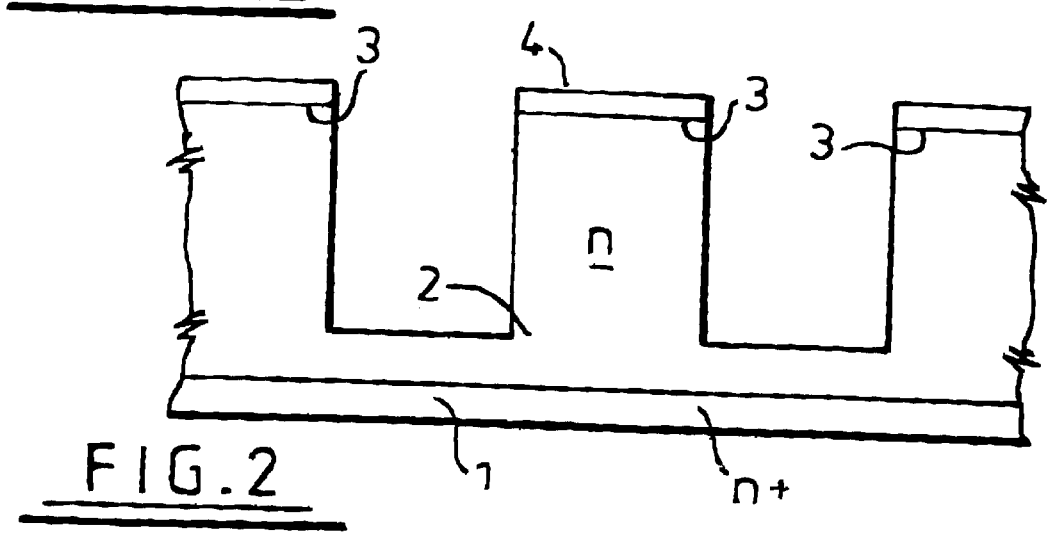
FIG. 2 is a schematic illustration of the cross-section of FIG. 1 after trenches have been etched into the semiconductor body.

Referring to FIG. 1, a semiconductor body is formed on a substrate defining an n+ type semiconductor drain region 1. The semiconductor body comprises an n type drain region 2 extending to an upper surface 3 of the semiconductor body which supports a masking layer 4 which may be selectively removed by etching to define areas where trenches are to be formed in the region 2. The drain region 2 may be an epitaxial layer. The masking layer 4 may comprise a single material type, for example silicon dioxide, or it may be a multi-layer comprising several different materials, for example silicon dioxide/silicon nitride/silicon dioxide. After selective removal of the mask 4, trenches are etched to a predetermined depth through the exposed surface 3 and into region 2, as shown in FIG. 2, using a known method, for example reactive ion etching.

Typically, the illustrated multi-layer structure will be formed on a wafer substrate which might he 600 $\mu$m thick. The substrate in effect forms the drain region 1 of FIG. 1. The layers 2 and 4 built up on the substrate will be very much thinner than the substrate itself. For example, the region 2 may be 6 $\mu$m thick. The layer 1 is shown in the Figures as being relatively thin simply for the purposes of illustration.

Figure 3:
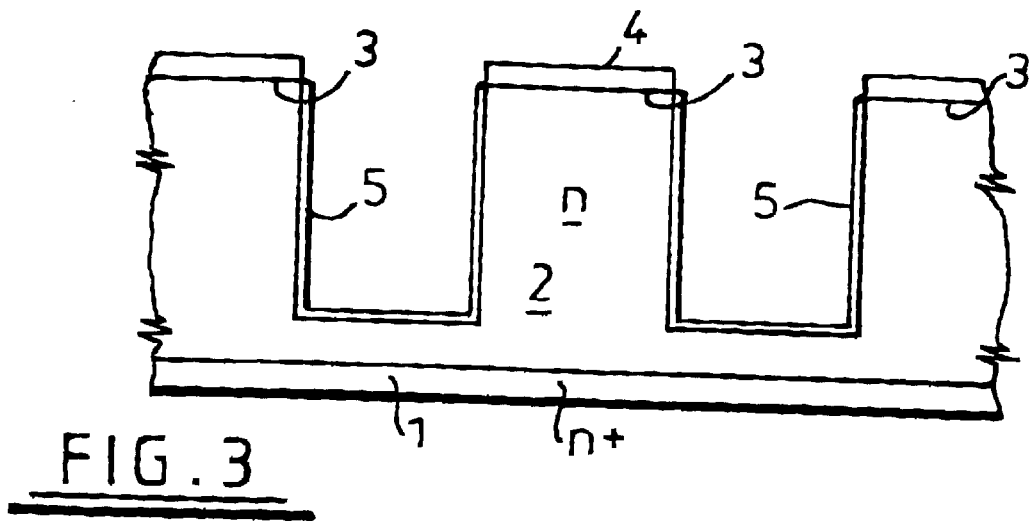
FIG. 3 is a schematic illustration of the cross-section of FIG. 2 after the trenches have been coated with oxide material.
Figure 4:
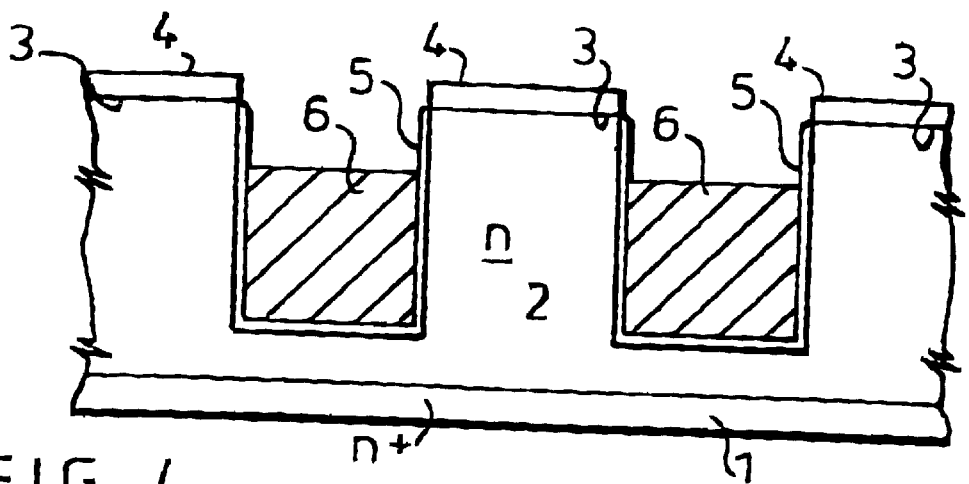
FIG. 4 is a schematic illustration of the cross-section of FIG. 3 after the trenches have been partially filled with polysilicon.

An insulating layer 5 is formed using a known technique on the walls of the trenches as shown in FIG. 3. One such known technique is thermal oxidation. Layer 5 may also be formed as a composite oxide/nitride layer. Some or all of the layer 5 may comprise deposited material. Following layer 5 formation, a gate material 6, for example polysilicon, is introduced into the trenches, for example using a low pressure chemical vapour deposition technique. The polysilicon gate material 6 is arranged to partially fill the trenches, as shown in FIG. 4, for example by first filling the trenches and then etching back some of the polysilicon 6. The polysilicon 6 may be doped to effect an improvement in conductivity. This may be done during or after deposition. In an alternative method, aluminium gates may be arranged partially to fill the trenches, without requiring to be etched back, using a method described in WO 9700536.

Figure 5:
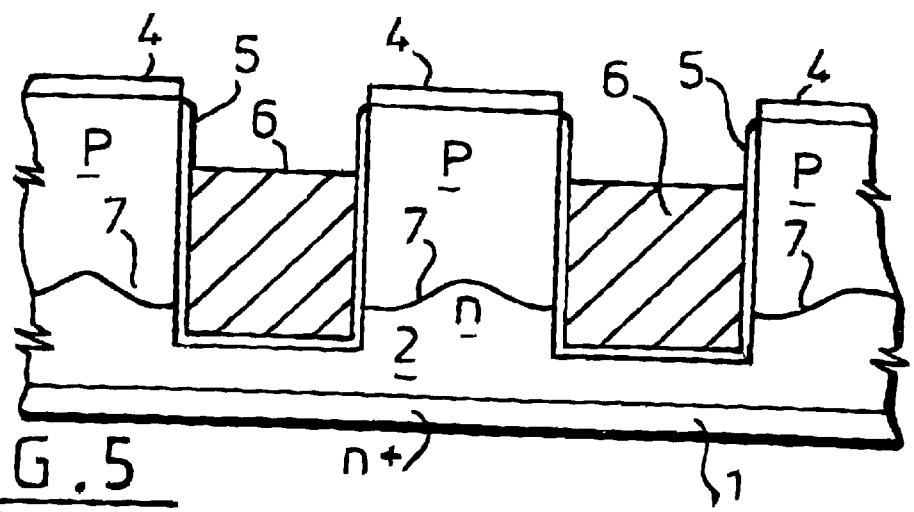
FIG. 5 is a schematic illustration of the cross-section of FIG. 4 after the semiconductor body has been doped with p-type dopant.

Referring to FIG. 5, p-type body dopant is introduced laterally into region 2 through the sidewalls of the trenches. The body dopant introduced through the trench sidewalls initially remains close to those sidewalls. The dopants are then diffused to form p-type body regions 7. The body dopant may be introduced into the trench sidewalls using charged dopant ions (for example ionic boron) which pass directly through the oxide layer 5 and into the region 2. The ions may be directed into the trenches using for example an angled source, divergent source or an isotropic source. More than one implant step may be used to introduce the total body dopant, for instance a separate source for each side of the trenches may be utilised. The composition and thickness of the trench masking layer 4, and the energy of some or all of the body implants, may be chosen such that some body dopant enters the upper surface of the substrate through the masking layer 4, as well as laterally through the trench sidewall. For example, although not shown in FIG. 5, dopant penetration into the upper surface 3 of the semiconductor may be enhanced by prior partial etching of the masked layer 4 in the vertical direction in order to reduce its thickness. Alternatively or in addition, one dopant may be ion implanted at a relatively low energy, such that the mask 4 is not penetrated substantially by the dopant, whereas the other dopant may be implanted at a relatively high energy such that the mask 4 is substantially penetrated by the dopant. Alternatively, other known methods of dopant introduction may be used, for example gaseous predeposition. Some methods may require that the oxide layer 5 is first removed from the walls of the trenches above the gate material.

The position of the boundary between the body regions and the n-substrate region depends upon the distance penetrated by the body dopant within the substrate, and upon the vertical position of an upper surface of the gate material 6 within the trenches. The penetration distance can be closely controlled, and therefore the position of the boundary relative to the upper surface of each gate region 6 is accurately determined.

Figure 6:
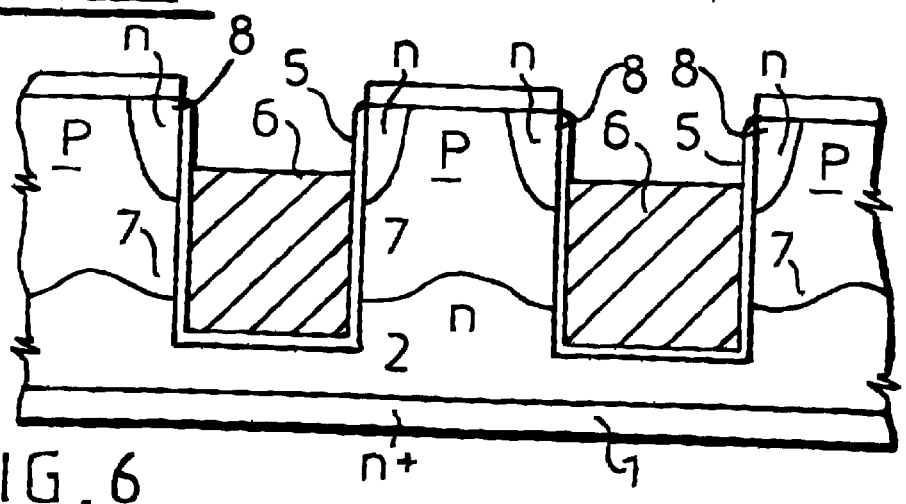
FIG. 6 is a schematic illustration of the cross-section of FIG. 5, after the semiconductor body has been doped with n-type dopant.

Referring now to FIG. 6, source dopant is introduced laterally through the side walls of the trenches, using a technique such as one of those described above, to form source regions 8. As illustrated, the source dopant is implanted through the oxide layer 5 on the trench wall, but it would be possible to remove the outer layer 5 before the introduction of the source dopant. The source dopant is prevented from entering at least part of the upper surface of the substrate by those portions of the trench masking layer 4 which have not been removed. The diffusion of the source dopant is arranged such that it penetrates to a lesser distance than the body dopant, so that a portion of body region 7 is interposed between each source region 8 and drain region 2. The penetration distance of the source dopant is closely controlled such that the position of the boundary between the regions 7 and 8 relative to the position of the upper surface of each gate region 6 is accurately determined. It will be appreciated that driving in the source regions 7 may cause some further diffusion of the dopant forming the body regions 8, but this further diffusion can be taken into account when determining the desired relative positions of the source and body region boundaries.

Since any variation in the vertical position of the upper surface of each gate region 6 affects the vertical penetration distance of both body and source dopants equally, the vertical extent of body region 7 between the sources 8 and the drain region 2 will be substantially the same throughout the lateral area of the substrate. Consequently, the vertical thickness of the portion of body region 7 interposed between a source region 8 and the drain region 2, known as the channel width, is accurately determined.

Figure 7:
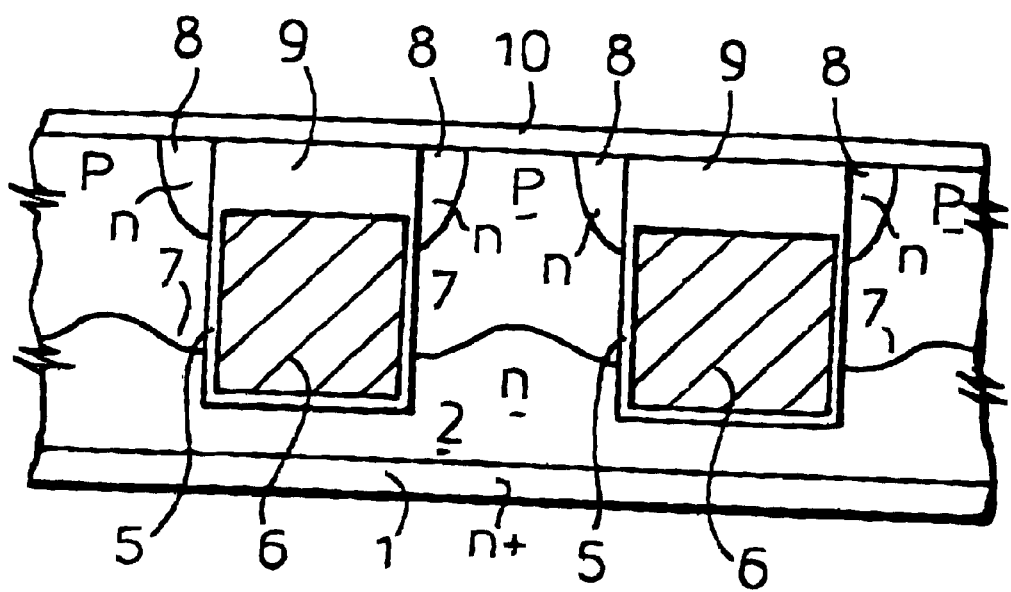
FIG. 7 is a schematic illustration of a cross-section of part of a n-channel (n p-n) UMOS device which has been fabricated according to the invention.

The fabrication method is completed, as shown in FIG. 7, by isolating the uppermost surface of the etched-back polysilicon gates 6 with an insulating material 9, and by completely removing the mask 4 to expose the upper surface of the silicon. A layer of metal 10 is then added to the upper surface of the structure, to form an electrical contact to the source and body regions. A shallow p-type implant may additionally be carried out, after the removal of layer 4, in order to boost the p-type dopant concentration and thereby improve the electrical contact between the body regions 7 and the metal region 10. The gate regions 6 will be connected elsewhere to a gate contact metallisation region.

In any of the above embodiments p and n type regions may be interchanged throughout to arrive at a p-channel (p-n-p) rather than n-channel (n-p-n) structure.

In any of the above embodiments, an additional layer beneath layer 1 and of opposite type to layer 1 may be present, resulting in the formation of a n-channel or p-channel IGBT structure.

The attached drawings show the formation of two adjacent trenches. It will be appreciated that the method of the present invention may be applied to a wide variety of trench configurations, for example the formation of a hexagonal array in which trenches are etched in spaces defined between a tightly packed array of hexagonal mesa areas on the surface of a substrate.

The above-described method refers to an embodiment in which the first-introduced dopant forms the body regions 7 and the second-introduced dopant forms the source regions 8. An alternative possibility is that the second-introduced dopant is arranged to penetrate to a final position deeper than the final position of the first-introduced dopant. In this case the second-introduced dopant forms the body regions and the first-introduced dopant forms the source regions. This is a feasible approach, at least in the fabrication of an n-channel structure, due to the different rates of diffusion of the different dopant species usable for body and source regions, and the possibility of using ion implantations at different energies for the introduction of each dopant. The advantage of such a method is that remaining portions of the trench mask 4 can be used to mask the first (source) dopant, but removed before the introduction of the second (body) dopant, such that body dopant enters the upper surface of the semiconductor body as well as the trench sidewalls.

A further possibility is to diffuse (drive-in) both dopants simultaneously following an initial introduction of both source and body dopants. This approach has two advantages. Firstly, both body and source dopants are subjected to exactly the same drive-in conditions, so that any unintentional wafer-to-wafer and batch-to-batch variations in manufacturing conditions, e.g. related to furnace operation, are applied to both dopants equally, thereby improving uniformity in the final channel width. Secondly there is an associated reduction in the complexity of the manufacturing process, as separate body and source drives are replaced by a single drive.

As a consequence of any of the above methods of production, the channel width of a resulting UMOS structure is dependent only on the diffusion distances of the body 7 and source 8 regions, since both are aligned to the same physical feature (i.e. the position of the top of the etched-back gate polysilicon 6). Variations in the position of this feature do not alter the relative positions of the body 7 and source 8, and therefore do not alter the vertical extent of the channel width region between the source 8 and drain region 2. This allows the vertical extent of the channel to be optimised with greater precision than is possible with prior art fabrication methods. The junction depths are determined by the lateral introduction of the body and source dopant ions, which provides for substantially identical and uniform depths of body 7 and source 8 at every position within the device active area, thereby ensuring that the critical 'channel width' dimension is substantially uniform across the device active area.

In contrast to other known methods of UMOS fabrication, the present method requires no critical mask alignments. This allows a substantial reduction in lateral dimensions within the active area of the UMOS structure, and a corresponding increase in the density of UMOS trench edge per unit area. Regions of p+ doping in the body regions, commonly seen in the prior art, are unnecessary due to the very close spacing of trenches, which spacing is made possible by the absence of critical masking of the source regions.

What is claimed is:

1. A method of semiconductor device fabrication comprising forming at least one indentation in a surface of a semiconductor body, partially filling the indentation with a filler material such that walls of the indentation are exposed above an upper surface of the filler material, and introducing and diffusing first and second dopants through the exposed walls of the indentation to form first and second doped regions, the first doped region extending into the semiconductor body around the filled portion of the indentation to a first region boundary which is at a predetermined first depth relative to the upper surface of the filler material, and the second doped region extending into the semiconductor body around the filled portion of the indentation to a second region boundary which is at a predetermined second depth relative to the upper surface of the filler material, the first and second depths being different such that a region of predetermined thickness is defined adjacent the indentation between the first and second boundaries.

2. A method according to claim 1, wherein the indentation is an elongate trench.

3. A method according to claim 1, wherein the step of partially filling the indentation with a filler material comprises filling completely the indentation with filler material, then etching the filler material part way into the indentation.

4. A method according to claim 1, wherein the filler material is polysilicon.

5. A method according to claim 1, wherein a layer of dielectric is formed upon surfaces of the indentation prior to the indentation being partially filled.

6. A method according to claim 5, wherein one or both of the dopants are introduced into the walls of the indentation through the dielectric layer.

7. A method according to claim 5, wherein the dielectric layer is at least partially removed from those surfaces of the indentation which are exposed above the partially filled portion of the indentation, prior to the introduction of one or both of the dopants.

8. A method according to claim 1, wherein at least one of the dopants is produced by an ionic source which is disposed at an angle to the indentation.

9. A method according to claim 1, wherein at least a portion of a previously defined masking layer substantially prevents one or both of the dopants from entering at least a portion of the surface of the semiconductor body.

10. A method according to claim 9, wherein the thickness and composition of the previously defined masking layer is such that it functions substantially as a barrier to the introduction of one of the dopants but is substantially penetrated by the other dopant.

11. A method according to claim 10, wherein the one dopant is introduced by ion implantation carried out at a relatively low energy and the other dopant is introduced by ion implantation carried out at a relatively high energy.

12. A method according to claim 1, wherein the first dopant is arranged to penetrate further into the side walls of the indentation than the second dopant.

13. A method according to claim 1, wherein the second dopant is arranged to penetrate further into the walls of the indentation than the first dopant.

14. A method according to claim 9, wherein at least a portion of the previously defined masking layer covering at least a portion of the surface of the semiconductor body is arranged such that it functions substantially as a barrier to the introduction of the one dopant, but is at least partially removed prior to introduction of the other dopant.

15. A method according to claim 1, wherein the first and second dopants are diffused simultaneously to form the first and second doped regions.

16. A method according to claim 1, wherein the semiconductor device is a MOSFET with gate regions provided by the filler material, body regions provided by the deeper of the first and second doped regions, and source regions provided by the shallower of the first and second doped regions.

17. A method according to claim 16, wherein the MOSFET is a n-channel (n-p-n) type structure.

18. A method according to claim 16, wherein the MOSFET is a p-channel (p-n-p) type structure.

19. A method according to claim 1, wherein the semiconductor body is formed on a further body of semiconductor which defines a drain region.

20. A method according to claim 19, wherein a further layer of opposite conductivity type to the further body of semiconductor is formed on a side of the further body of semiconductor remote from the surface of the semiconductor body.

* * * * *